US006599492B2

(12) United States Patent
Iwamura et al.

(10) Patent No.: US 6,599,492 B2
(45) Date of Patent: Jul. 29, 2003

(54) ONION-LIKE CARBON FILM AND ITS PRODUCTION

(75) Inventors: Eiji Iwamura, Kobe (JP); Takashi Kinoshita, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 09/818,594

(22) Filed: Mar. 28, 2001

(65) Prior Publication Data
US 2002/0061397 A1 May 23, 2002

(30) Foreign Application Priority Data

Sep. 27, 2000 (JP) ........................................ 2000-294996

(51) Int. Cl.$^7$ ............................................... C01B 31/02
(52) U.S. Cl. .............................. 423/445 B; 423/445 R; 427/524; 204/298.16
(58) Field of Search ...................... 423/445 R; 427/524; 204/298.16

(56) References Cited

U.S. PATENT DOCUMENTS

| | | | | | |
|---|---|---|---|---|---|
| 5,178,980 A | * | 1/1993 | Mort et al. | ............... | 430/58.05 |
| 5,346,600 A | * | 9/1994 | Nieh et al. | .............. | 204/192.16 |
| 5,494,558 A | * | 2/1996 | Bunshah et al. | ........ | 204/192.12 |
| 6,224,725 B1 | * | 5/2001 | Glocker | ................. | 204/192.12 |
| 6,251,522 B1 | * | 6/2001 | Tanaka et al. | ........... | 423/445 B |

OTHER PUBLICATIONS

Kraetschmer et al, *Nature*, vol. 347, pp. 354–358, 1990.
Curl et al, *Scientific American*, pp. 54–63, Oct. 1991.
Lin et al, *Physical Review B*, vol. 49, No. 7, pp. 5020–5023 Feb. 1994.
Baum, *C& EN*, pp. 22–25, Oct. 29, 1990.

* cited by examiner

*Primary Examiner*—Stuart L. Hendrickson
*Assistant Examiner*—Peter J Lish
(74) *Attorney, Agent, or Firm*—Oblon, Spivak, McClelland, Maier & Neustadt, P.C.

(57) ABSTRACT

An onion-like carbon thin film is provided which contains carbon as a main component, has a film thickness of at least 20 nm or more, and has clusters of an onion-like structure. Specifically, there is provided the onion-like carbon thin film satisfying the foregoing requirements, and in which (1) at least 20 or more clusters each having a diameter of 4 nm or more, and having an onion-like structure are contained per 0.001 $\mu m^2$; or (2) the proportion of clusters each having an onion-like structure in a matrix is at least 50% by volume or more. The onion-like carbon thin film of the present invention is very useful in terms of availability in various industrial fields as a hard protective film or a solid lubricating film of the surface in various machine parts, electronic parts, and the like, or as a field electron emission material, or the like, an electronic part of a field emission display, or the like.

13 Claims, 6 Drawing Sheets

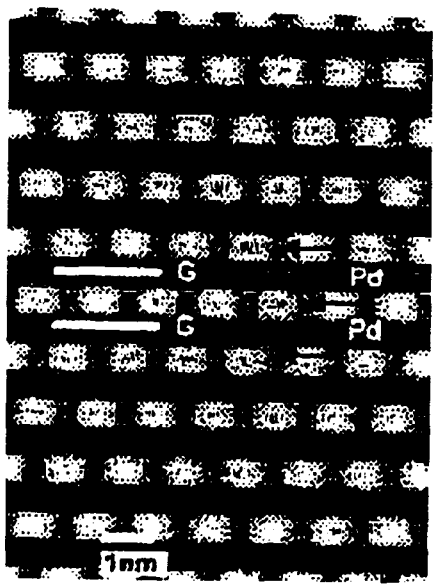
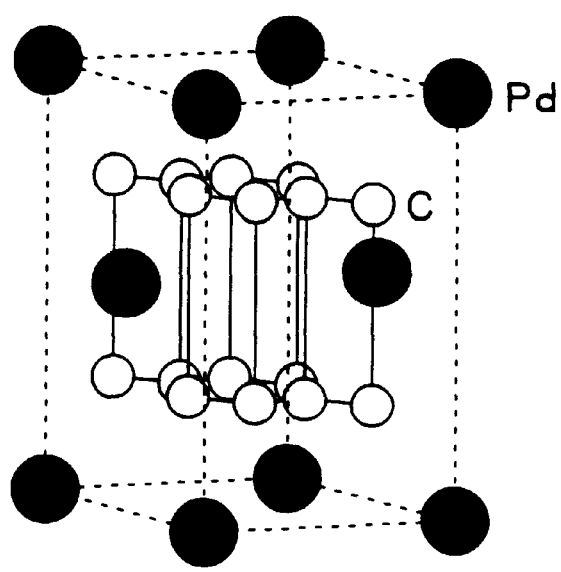
FIG. 3A  FIG. 3B

ONION-LIKE CARBON FILM AND ITS PRODUCTION

BACKGROUND OF THE INVENTION

1. Field of the Invention

The present invention relates to an onion-like carbon thin film and its production method. Onion-like carbon thin films of the present invention are very useful in terms of availability in various industrial fields as hard protective films and solid lubricating films of the surfaces in various machine parts, electronic parts, and the like, or as field electron emission materials, and the like, electronic parts of a field emission display, and the like.

2. Description of the Prior Art

As the crystallized form of carbon, two types, i.e., diamond and graphite are known in the art. However, $C_{60}$ (commonly called fullerene) was discovered as a novel soccer-ball-like crystallized form by Kroto et al., in 1985 [see H. W. Kroto et al., "Nature", 318 (1985), 162]. By subsequent studies, fullerene molecules, higher fullerenes, solid-phase fullerenes, fullerene compounds, metallofullerenes, nanotubes, nanocapsules, and onion-like carbons were found as fullerene substances. These fullerene substances exhibit diverse characteristics such as superconductivity, conductivity, semiconducting property, insulating property, ferromagnetism, and super-atomic property. Accordingly, they have possibilities of being applicable to various uses such as nanotransistors/diodes, electron emissive elements, single-electron devices, photosensors, electrophotographic photoreceptors, very high speed electronic devices, superconductive magnets, solar batteries, solid lubricants, three-dimensional non-linear optical elements, very high speed optical switching elements, light-weight permanent magnets, gas storage units (oxygen, hydrogen, argon, and the like), and super-atomic structures.

Out of these, an onion-like carbon is referred to as various names such as bucky onion, onion-like fullerene, and onion-like graphite, and it is a kind of giant fullerene. It has a structure in which around the perimeter of the core at the central portion comprising $C_{60}$ or the like, fullerenes each having a still larger molecular weight are concentrically stacked one on another. The onion-like carbon having such a giant fullerene structure is expected to find application as various functional materials centering on the electronic devices as described above not only because it has physical properties resulting from its specific structure but also because novel functions are exhibited by trapping metal atoms [ex., Pd, and the like, (Oku et al., "Materials Integration", 12 (1999), 97)], hydrogen atoms, or the like therein.

For synthesis of fullerene substances, there are proposed a very high temperature synthesis method by an arc discharge method, or the like [see, ex., T. W. Ebbesen et al., "Nature" 358 (1992), 220], a method in which a mixed solution of a phenol resin and a cellulose derivative is baked (JP-A-No. 1311/1999), a laser ablation method in which an ultraviolet laser is applied to the graphite surface, and the like. However, since the fullerene substance is generally extracted from a soot-like substance, it is considered difficult to form it in thin film. For this reason, there is proposed a method in which a thin film is formed by using a specific fullerene derivative with an LB (Langmuir Blodgett) method (JP-A-No. 322682/1999). As the methods for manufacturing a carbon fiber material having a cross section of an onion-like structure, there are proposed a method in which a meso-phase pitch is subjected to melt-spinning, and then subjected to an infusibilization treatment and a baking treatment to form a carbon fiber (JP-A-No. 212626/1998), a method in which a carbon fiber and a carbonaceous binder are formed in lamination, followed by baking at a temperature of 2300° C. or more (JP-A-No. 125334/1998), and the like. Further, for the onion-like structure, there is known a method in which an electron beam is applied to an amorphous carbon. For example, there are proposed a method in which ultra-fine particles forming nuclei are disposed on an amorphous carbon substrate, and then irradiated with a high energy beam (JP-A-No. 92124/1999), a method in which a substance having a triple bond or a double bond of carbon is irradiated with X-rays, a microwave, a supersonic wave, electron beams, and the like (JP-A-Nos. 109310/2000 and 16806/2000), and the like.

However, the foregoing methods have the following problems.

It is difficult that the soot-like materials and fibrous materials obtained by, for example, the methods disclosed in JP-A-Nos. 1311/1999, 212626/1998, and 125334/1998 described above are applied and developed to be adaptable for use as electronic devices in terms of their forms. This is because a thin film-like material having an appropriate thickness cannot be obtained on a substrate such as a silicon wafer as with an LSI or the like by the foregoing methods.

Further, with the synthesis methods by electron beam irradiation disclosed in JP-A-Nos. 92124/1999, 109310/2000, and 16806/2000, the probability that onion-like structures are homogeneously formed on the irradiated substrate is low. Therefore, it is difficult to form such a compact thin film that the film is filled up with onion-like structures. Further, there is also a problem that a uniform film cannot be formed because of a difference in the manner of growth. Such being the case, it is impossible to obtain a uniform and compact thin film having onion-like structures over a wide range. On the other hand, with a substrate for a recent electronic device, a thin film with a relatively large film thickness [at least about 100 nm or more, and a thick film of $\mu$m order (about 1–5 $\mu$m) is also required when the film is patterned in a three-dimensional structure] becomes necessary with upsizing of the display area. In addition, there is a growing demand for a uniform thin film in which the cluster structures given thereto are made compact for a purpose of ensuring quality.

SUMMARY OF THE INVENTION

The present invention has been made in view of the foregoing circumstances. It is therefore an object of the present invention to provide an onion-like carbon thin film comprised of giant fullerene clusters having onion-like structures, and its production method.

The onion-like carbon thin film of the present invention which has accomplished the foregoing object is characterized by comprising carbon as a main component, having a film thickness of at least 20 nm or more, and having clusters of an onion-like structure. Specifically, the onion-like carbon thin film of the present invention further satisfies the following requirements (1) and (2).

(1) At least 20 or more clusters each having a diameter of 4 nm or more, and having an onion-like structure are contained therein per 0.001 $\mu m^2$; and (2) The proportion of clusters each having an onion-like structure in a matrix is at least 50% by volume or more.

A method for producing the onion-like carbon thin film in accordance with the present invention, whereby the foregoing problems can be solved, comprising a step of sputter-forming a film to a film thickness of at least 20 nm or more such that the plasma space potential is lower than the surface potential of a base material to be subjected to film formation. Herein, it is the preferred embodiment of the present invention that the film is sputter-formed by applying the base material to be subjected to film formation with a positive bias voltage. Particularly, if the film is sputter-formed by using an unbalanced magnetron sputtering method, a desired onion-like carbon thin film can be obtained with efficiency.

BRIEF DESCRIPTION OF THE DRAWINGS

FIGS. 3(a) and 3(b) are schematic diagrams showing a laminated cross-sectional structure of an atomic level when Pd is used for intercalation;

DETAILED DESCRIPTION OF THE PREFERRED EMBODIMENTS

In view of the following circumstances: "even though an onion-like carbon thin film is expected to be utilized for a functional material such as an electronic device material or a superconducting material taking advantage of the characteristics based on its specific structure, it has been impossible to obtain uniformly a compact thin film having onion-like structures, and having an appropriate thickness over a wide range of matrix with the methods hitherto disclosed", the present inventors have made a close study to provide an onion-like carbon film satisfying such various requirements. As a result, it has been indicated that when an amorphous carbon having a film thickness of about 100 nm is irradiated with an electron beam in a transmission electron microscope, onion-like carbon clusters having a prescribed size are locally formed. The present inventors have noticed this finding, and further continued the study on the relationship between the irradiation conditions of the electron beam to be applied to the thin film and the formation condition of onion-like clusters. As a result, they have found that, if a thin film is irradiated with an electron beam having appropriate energy and flux during the process of forming the thin film, a desired thin film containing onion-like carbon clusters can be formed. Thus, they have completed the present invention.

First, a description will be given to an onion-like carbon thin film of the present invention.

Figure 1:
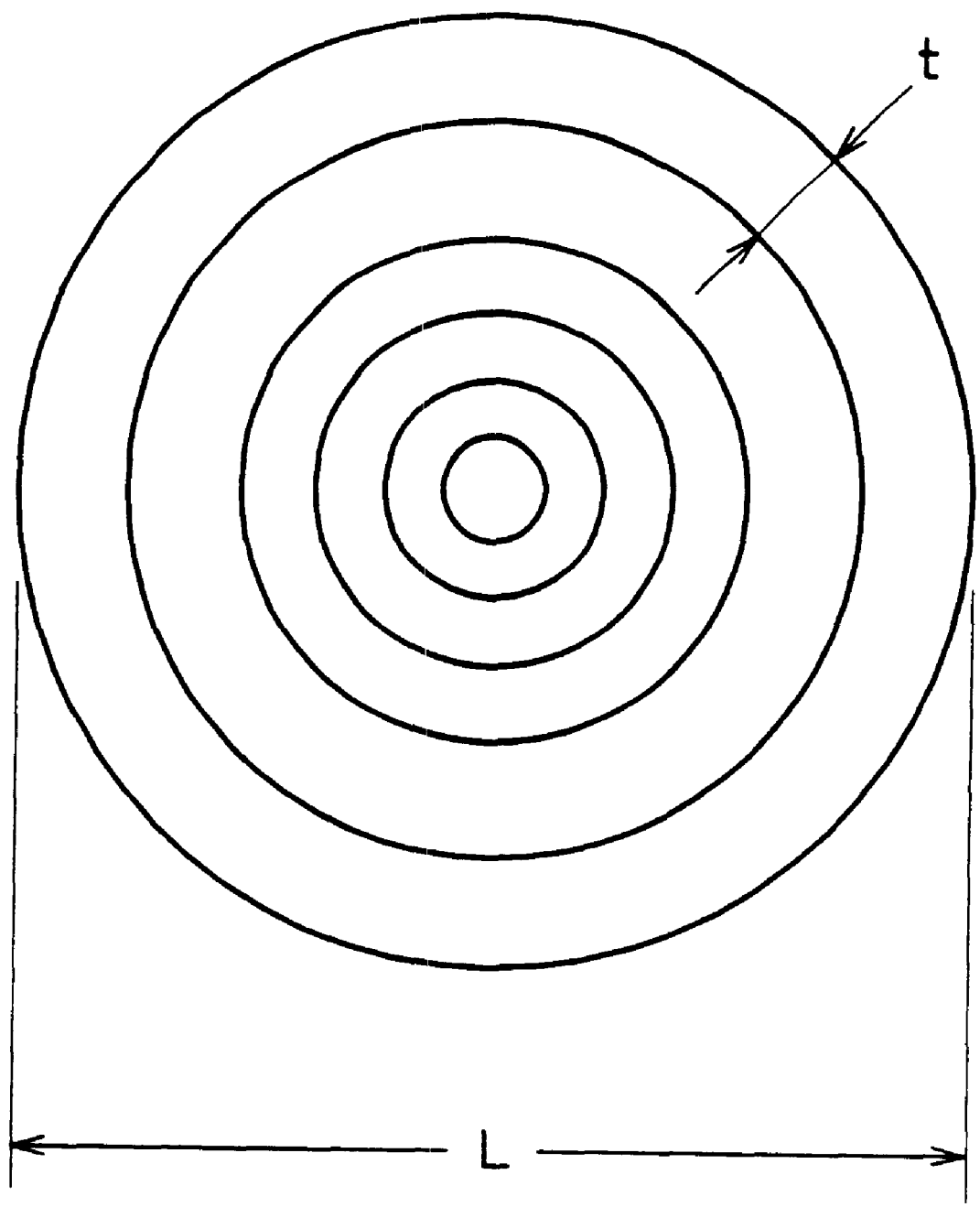
FIG. 1 is a cross-sectional schematic diagram showing a carbon onion cluster structure.
Figure 2:
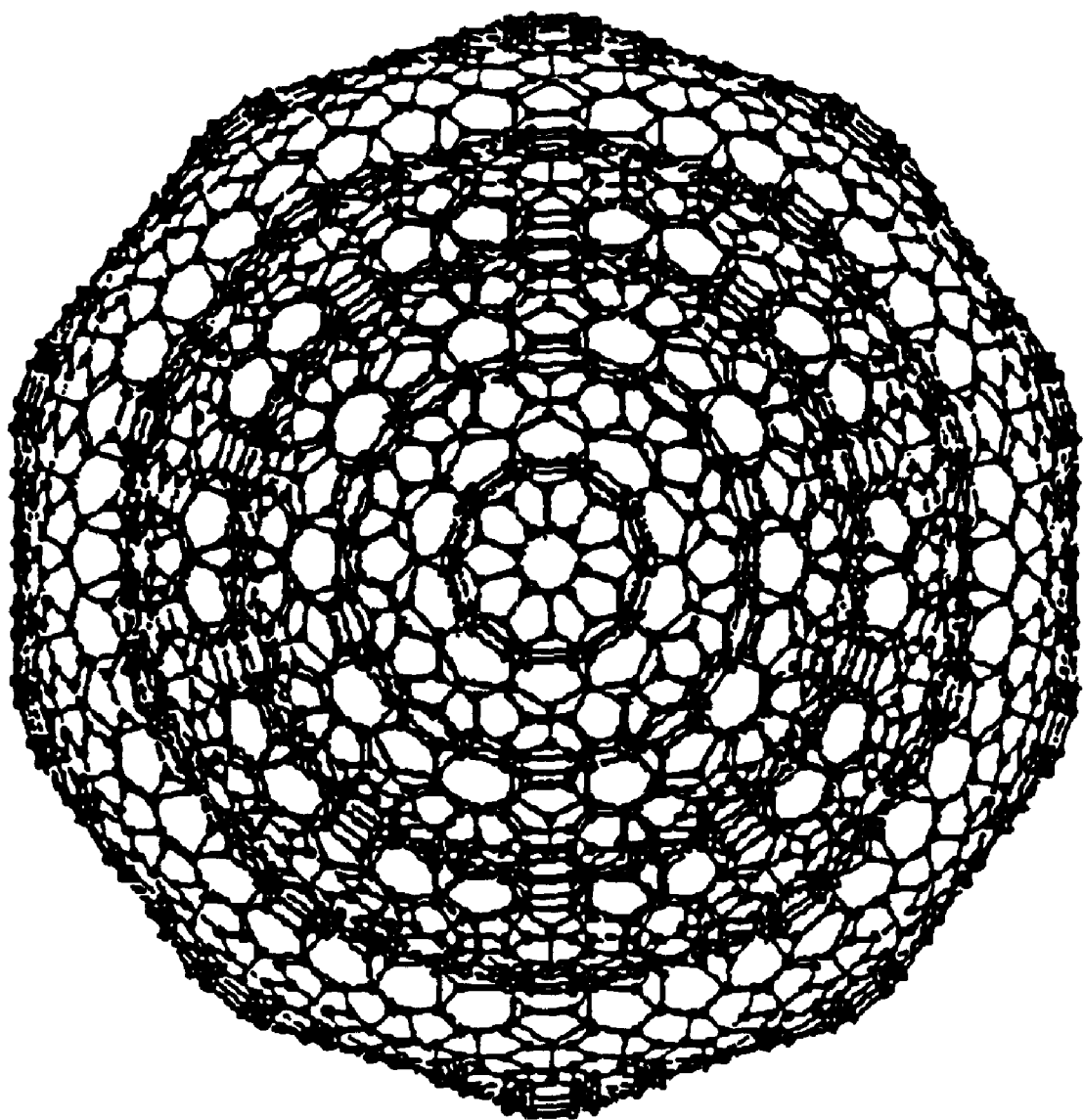
FIG. 2 is a schematic diagram showing a projected atomic arrangement model from a fivefold symmetry axis of $C_{1500}$.

The onion-like carbon thin film of the present invention contains clusters each having a shell structure in which the C-planes (π bond planes) are laminated in the form of spherical shells (may be also referred to as the form of onion, or the form of concentric spheres) as shown in FIG. 1. Such a cluster is generally considered to be one type of giant fullerenes, and it is supposed to have a structure similar to the atomic arrangement model shown in FIG. 2. Specifically, the model shown in FIG. 2 is the one shown by Q. Ru et al., [see Q. Ru et al., "Chem. Phys. Lett.", 259 (1996), 425], and it is the fivefold symmetry axis model of $C_{1500}$ wherein fullerene clusters have a nested structure. The number of shells constituting the cluster, i.e., the number of atoms varies according to the size of the cluster.

The onion-like carbon thin film of the present invention is characterized by containing carbon as a main component, having a film thickness of at least 20 nm or more, and predominantly having onion-like structured clusters in its matrix. The onion-like carbon thin film predominantly having onion-like structured clusters in its matrix, and having a film thickness of 20 nm or more has not been obtained heretofore. For example, with the method disclosed in JP-A-No. 92124/1999 in which merely an energetic particle beam is applied to the surface, in actuality, it is considered that clusters are formed only in the very outermost surface of (an about 10-nm-thick) thin film. In the present invention, its technological significance lies in that a uniform onion-like carbon thin film at a practical level can be provided.

The wording "containing carbon as a main component" herein used means either "consisting of only carbon" or "being mainly comprised of carbon, but comprising elements other than carbon".

For example, the foregoing network structure of FIG. 2 consists of only a carbon atom.

Further, as the elements other than carbon, mention may be made of boron, nitrogen, and the like. It is possible that the structure appropriately contains very various metallic elements, and the like for the purpose of improving electrical, optical, magnetic, and mechanical characteristics, and the like. Particularly, the insertion of an element other than carbon (Pd for FIG. 3) between concentric carbon layers as shown in FIG. 3 is referred to as intercalation. Heretofore, the intercalations for graphite have been shown with various elements such as Cs, Rb, K, Pd, Li, and Al. [M. S. Dresselhaus et al., "Advances in Physics", 30 (1981), 139.; Oku et al., "J. Mater. Chem.", 8 (1998), 2113, etc.]. FIG. 3(a) is the processed image of an HREM image of an onion-like structure including Pd. and FIG. 3(b) is a Pd intercalation model. Further, the one obtained by intercalating a different type of atom or a different type of material into the core of the spherical shell structure is called nanocapsule. It has been shown heretofore with Co, Fe, Ni, Cu, CrC, MoC, $MoO_3$, $WC_x$, $WO_3$, TiC, SiC, or the like. Examples of the "element other than carbon" to be used in the present invention can include all the elements described above, but they are not limited thereto. In short, all the elements and compounds which can be encapsulated in onion-like carbons or fullerenes are included in the scope of the present invention. It is noted that the element other than carbon described above is contained therein in such an amount as not to break the network of the onion-like structure of carbons, and it is recommended that the amount is preferably controlled to 50 atom percent or less, (and more preferably 30 atom percent or less).

Further, the film thickness of the onion-like carbon thin film in accordance with the present invention is at least 20 nm or more. If it is less than 20 nm, it is difficult to obtain a thin film structure of uniform onion-like clusters including 20 or more nuclei of clusters having a diameter of 4 nm or more as in the condition (1), or a thin film structure having a volume fraction of 50% or more as in the condition (2). The film thickness thereof is preferably 50 nm or more. The film thickness increases with an increase in cluster size or volume fraction. However, if a thin film with a volume fraction of generally 60% or more is sought, it is recommended that the film thickness is set at generally 100 nm or more. Further, although the upper limit of the film thickness has no particular restriction so long as it falls within the range of a thin film in the technical field of the present invention, it is generally in the range of from several hundred nm to 1 µm, and about 5 µm at maximum.

Specifically, the thin film of the present invention is the onion-like carbon thin film satisfying the foregoing requirements, (1) which contains 20 or more clusters having an onion-like structure, and a diameter of 4 nm or more per 0.001 µm$^2$ (33 nm×33 nm) (below, referred to as embodiment (1)), or (2) wherein the proportion of clusters each having an onion-like structure in a matrix is 50% by volume or more (below, referred to as embodiment (2)).

Out of these, with the embodiment (1), the size and number of clusters constituting the onion-like carbon thin film are specified. Whereas, with the embodiment (2), the volume fraction of clusters is specified. Thus, both the embodiments are specified from the different viewpoints. However, either of these embodiments is no different from the one which specifies the objective "compact and uniform onion-like carbon thin film predominantly having onion-like structures over a wide range of a matrix, and having an appropriate thickness".

Further, the thin film of the embodiment (1) contains at least 20 or more clusters having an onion-like structure, and having a diameter of at least 4 nm or more, (and preferably 6 nm or more) per 0.001 µm$^2$. Here, the diameter of the cluster is expressed by a reference character "L" (cluster size) in FIG. 1. Incidentally, a reference character "t" in FIG. 1 denotes the interlayer spacing (interplanar spacing between π bond planes), and its range may vary according to the onion-like carbon structure, and the element (such as Pd of FIG. 3 as described below) to be intercalated between layers. For example, when only carbon is contained therein, t is of the order of about 0.3 nm. Whereas, when another element is contained therein, t increases, so that it may exceed 0.4 nm. In the present invention, the value of the reference character "L" is specified, while the value of "t" is not particularly specified.

In general, the size and the number, and the volume fraction of the clusters exhibit correlation, and the volume fraction tends to increase with an increase in size. However, with the foregoing embodiment (1) specified in the present invention, the size and the number of the clusters are specified after all, and even the volume fraction is never specified. In short, all the onion-like carbon thin films each containing clusters satisfying the requirement (1) in a prescribed area are included in the scope of the present invention. Therefore, in the embodiment (1), the volume fraction of the clusters in the matrix is not necessarily required to be 50% by volume or more. Of course, the film satisfying the requirement (1), and having a volume fraction of 50% by volume or more is very useful because a compact and uniform film can be obtained over a wide range of the matrix.

Further, with the embodiment (2), the proportion of the clusters having an onion-like structure in the matrix is at least 50% by volume or more, (and preferably 60% by volume or more). In this embodiment, in short, it suffices that the volume fraction of the clusters in the matrix satisfies the requirement (2), so that it should not be construed that even the size and the number of the clusters are limited. Therefore, all the onion-like carbon thin films each having a volume fraction of 50% by volume or more are included in the scope of the present invention. In this case, the size and the number of the clusters are not necessarily required to satisfy the requirement (1). Of course, the film satisfying the requirement (2), and having the size and the number of clusters satisfying the requirement (1) is very useful because a compact and uniform film can be obtained over a wide range of the matrix.

Incidentally, the size, number, and volume fraction of the onion-like carbon clusters can be all determined by observing the plane-view or cross-sectional lattice image of the layer by means of a high resolution transmission electron microscope (TEM). By using a TEM, it is possible to recognize the cluster having a diameter ("L" in FIG. 1) of not less than 2 nm as the onion-like structure.

Specifically, in TEM observation, by taking a photograph of the lattice image of a microstructure formed by the interference between a transmitted electron beam and a diffracted electron beam, it is possible to examine the size of the cluster, and the like. More specifically, it is recommended that onion-like carbon clusters are discriminated from the concentric lattice images which have occurred in the microstructure texture (contrast between black and white which has occurred) to determine the volume fraction (=area proportion), and the cluster size.

The base material for forming the onion-like carbon thin film of the present invention has no particular restriction. Examples thereof include from a silicon wafer, glass, ceramic, iron-based materials, copper-based materials, and aluminum-based materials. Further, resin materials and the like are also usable.

Then, a method for producing the onion-like carbon thin film of the present invention described above will be explained.

First, in the present invention, the film is required to be sputter-formed to a film thickness of at least 20 nm or more so that the plasma space potential is lower than the surface potential of a base material to be subjected to film formation.

The method of the present invention is accomplished based on the film formation by magnetron sputtering (BM). It is required that a film is formed in the deposition process of sputtered atoms which have reached the base material, while electrons having appropriate energy are applied at an appropriate flux. Namely, such a relationship between the plasma space potential and the surface potential of the base material should be established that electrons stream to the base material to be subjected to film formation. For this reason, the film is required to be sputter-formed under such conditions that the plasma space potential is negative potential with respect to the base material surface potential at the base material position to be subjected to film formation. In this step, the base material itself is not necessarily required to be at a ground potential (earth potential), and it may be under floating conditions so long as it has a potential more plus than the plasma space potential. Alternatively, a positive bias voltage may be applied to the base material, whereby the same electron inflow effect can also be obtained.

Incidentally, the voltage to be applied to the base material depends on the difference between the plasma space potential and the ground potential. It is recommended that the lower limit value of the voltage is such a voltage that the base material is at a plus potential. At a voltage not less than this voltage, electrons are irradiated to the base material. With a conventional sputtering apparatus, a positive potential of 2 V or more is preferably applied thereto. The upper limit thereof has no particular restriction. However, it is preferably controlled to 200 V or less, (and more preferably 100 V or less) in view of the influences of heating through electron beam irradiation.

Whereas, although the method for applying the bias voltage has no particular restriction, direct-current voltage, direct-current pulse voltage, and the like can be adopted.

Further, in the present invention, the film is required to be formed to a film thickness of at least 20 nm or more. Examples of the method for controlling the film thickness include the following method. Namely, the film forming rate per unit time under appropriate film forming conditions (power of power source, gas pressure, distance between a base material and a target, and the like) are previously determined, and the film forming time is adjusted based on the film forming rate. Therefore, the film thickness controlling conditions cannot be uniquely determined, and they can vary according to the power of the power supply to be used, and the like. From the viewpoints of the productivity, manufacturing cost, and the like, it is generally recommended that they are controlled as follows. For example, for the static opposing film formation, the conditions are preferably controlled as follows: power of the dc power supply: 3–30 W/cm$^2$, the total gas pressure: 0.5–12 mtorr, and the distance between the base material and the target: 35–300 mm so that the film forming rate is at least 5 nm/min or more.

Incidentally, the unbalanced magnetron (UBM) sputtering method is particularly preferred for forming a desired onion-like carbon cluster with efficiency. The UBM sputtering method was developed for intentionally disturbing the balance of the magnetic field by using an electromagnetic coil or a permanent magnet in a conventional magnetron sputter cathode, and thereby increasing the ion irradiation dose on a film to improve the film quality and characteristics of the thin film.

Figure 4:
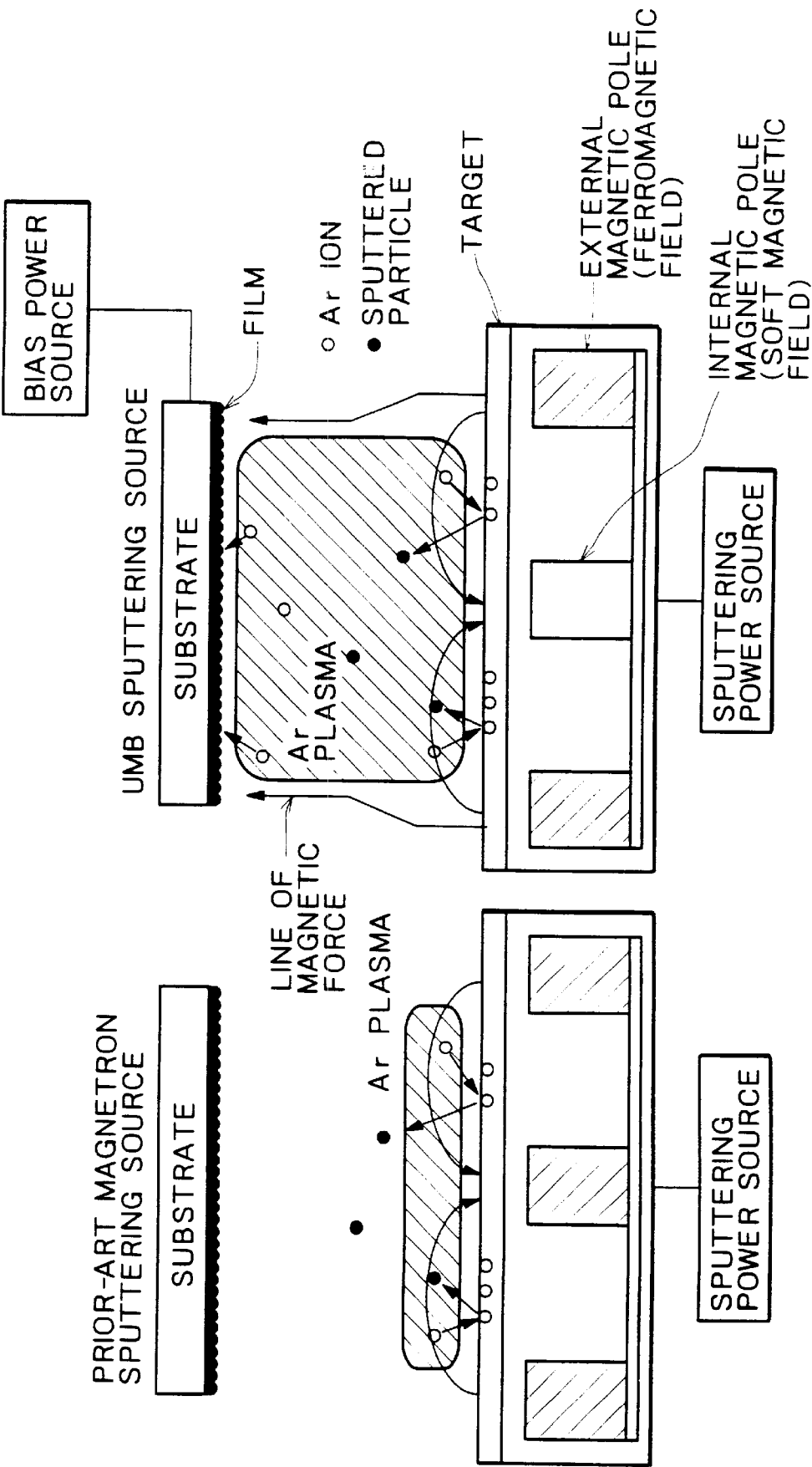
FIG. 4 is a schematic diagram of apparatus cross-sections showing a difference in principal between a balanced magnetron sputtering method and an unbalanced magnetron sputtering method.

FIG. 4 is a schematic diagram of the cross section of each apparatus showing the difference in principal between the BM sputtering method and the UBM sputtering method. First, by the UBM sputtering method, lines of magnetic force heading toward the base material from the vicinity of the target are formed. A high density, high energy plasma in the vicinity of the target diffuses along the lines of magnetic force, and hence a high plasma density is also formed in the vicinity of the base material. As a result, it becomes possible to irradiate the thin film under formation with an electron flux having a further higher electron density. For this reason, it is considered that more energy is supplied than with the BM sputtering method to promote the formation of a desired onion-like structured cluster.

The difference between the BM sputtering method and the UBM sputtering method will be described in more details. In the conventional BM sputtering, the mean free path of electrons relative to ions is very large, and hence the potential of the chamber or the base material is negative with respect to ground, so that no electron irradiation occurs. In contrast, in the UBM sputtering method, it becomes easy to form a film under such conditions that the plasma space potential is negative potential with respect to the base material to be subjected to film formation. In this step, film formation is preferably carried out under such a condition that the plasma space potential is a negative potential of $-2$ V or more with respect to the surface potential of the base material to be subjected to film formation.

The present invention will be described in details by way of the following examples. However, it is to be understood that the invention is not intended to be limited to the following examples, but all such modifications made without departing from the spirit or scope described above and below are included within the scope of the invention.

EXAMPLE

Various onion-like carbon thin films (Nos. 1–18) as shown in Table 1 were manufactured in the following manner.

First, a 4-inch-dia silicon wafer was set as a base material in a sputtering chamber (HSM-752 sputtering system manufactured by Shimadzu Corporation) so that the distance from a target was 55 mm. The chamber was then evacuated to a vacuum of $3\times10^{-6}$ torr or less. Thereafter, an Ar gas was introduced into the chamber to a pressure of 3 mtorr, and a high frequency power source was applied to generate an Ar plasma. Then, sputter etching of the base material surface by Ar ions was carried out at an rf power of 200 W for 5 minutes to perform ion cleaning of the silicon wafer surface.

Then, by using a sputtering target of 6-inch-dia graphite disposed in front of the wafer, and a UBM cathode in which a ferrite magnet was disposed at the central portion of its back side, and SmCo magnets were annularly disposed on its external periphery, or a conventional BM cathode in which ferrite magnets were disposed either at its central part and on its external periphery, a dc power of 1 kW was applied by a dc power source at an Ar gas pressure of 3 mtorr to form a plasma. Thus, by controlling the film forming time, a carbon film was formed with a thickness of from 1 nm to 1 μm. Incidentally, the film thickness was determined by cross-sectional observation of the thin film by means of an electron microscope.

Figure 5:
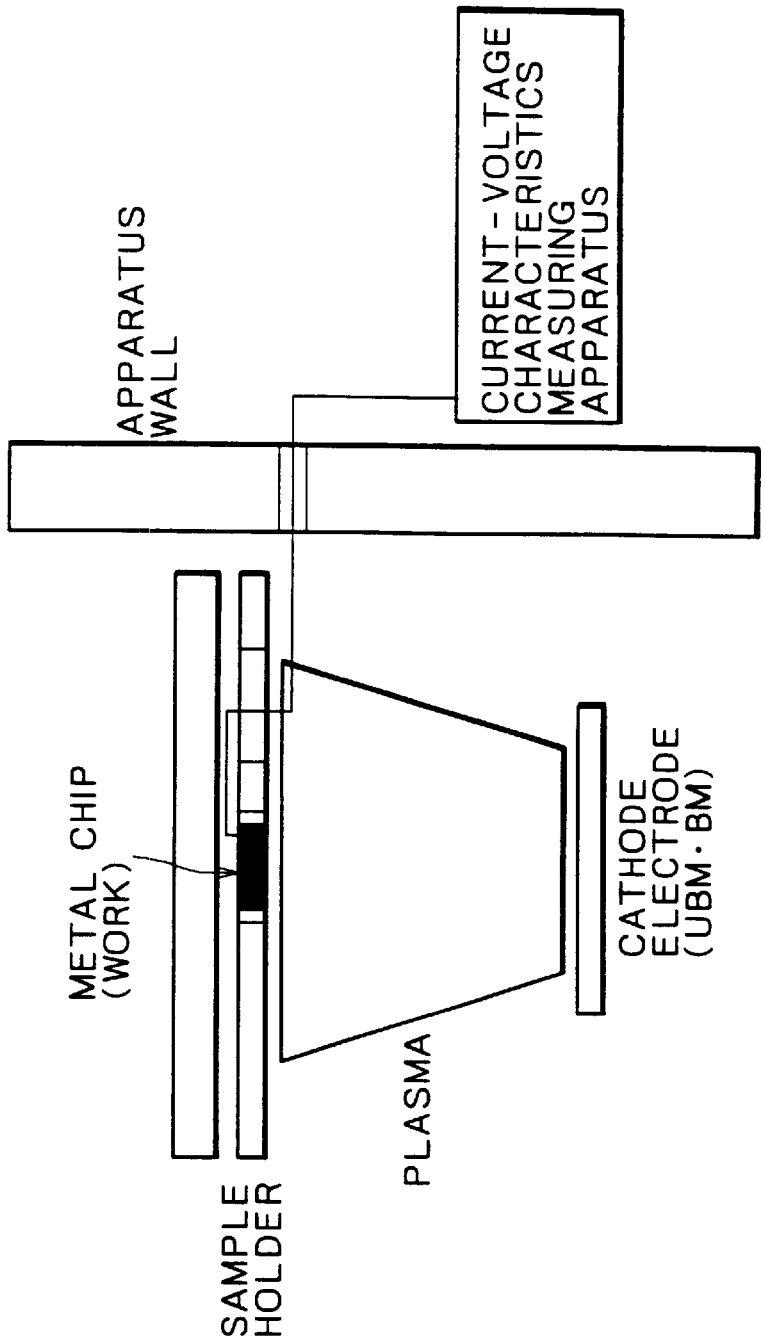
FIG. 5 is a schematic diagram showing a method for determining the plasma space potential adopted in each example.

The plasma space potential after film formation was evaluated by the determination method shown in FIG. 5, i.e., from the current-voltage characteristics at the base material position. The base material to be subjected to film formation was at earth potential, or applied with a dc bias voltage of from +100 V to −200 V.

TEM observation was carried out for each thin film sample subjected to film formation in the foregoing manner. TEM images of at least five or more fields of view were subjected to image analysis by means of an IBAS (manufactured by Carl Zeiss) image analysis system to determine the volume fraction of onion-like clusters, and the number of nuclei of clusters with a diameter of 4 nm or more present per 0.001 μm$^2$ (33 nm×33 nm). Table 1 shows both the formation conditions of each thin film, as well as the volume fraction of clusters and the number of the nuclei.

Figure 6:
FIG. 6 is a lattice image photograph by plane-view TEM observation of an onion-like carbon thin film.

FIG. 6 shows the TEM image (TEM photograph magnified a million times or more) of the onion-like carbon cluster observed in No. 1 (the inventive example). There is observed the formation of onion-like carbon clusters with a mean size of about 60 nm from the onion-like cross-section lattice image, and the volume fraction thereof is assumed to be about 70%.

TABLE 1

| No. | Constitutive element | Cathode structure | Plasma space potential (V) | Substrate potential (V) | Film forming time* | Film thickness (nm) | Onion-like carbon volume fraction (%) | Number of onion-like clusters with a diameter of 4 nm or more (number of the clusters/0.001 $\mu m^2$) |
|---|---|---|---|---|---|---|---|---|
| 1 | C | UBM | −7 | 0(earth) | 33.3 | 1000 | 70 | 35 |
| 2 | C | UBM | −7 | 0(earth) | 10 | 300 | 73 | 37 |
| 3 | C | UBM | −7 | 0(earth) | 1.67 | 50 | 51 | 25 |
| 4 | C | UBM | −7 | 0(earth) | 0.67 | 20 | 50 | 27 |
| 5 | C | UBM | −12 | 0(earth) | 10 | 300 | 80 | 45 |
| 6 | C | UBM | −7 | 25 | 10 | 300 | 85 | 42 |
| 7 | C | UBM | −7 | 50 | 10 | 300 | 82 | 38 |
| 8 | C | UBM | −7 | 100 | 10 | 300 | 85 | 41 |
| 9 | C | BM | 5 | 50 | 10 | 300 | 55 | 23 |
| 10 | C | BM | 5 | 100 | 10 | 300 | 60 | 25 |
| 11 | C/B/N | UBM | −7 | 0(earth) | 10 | 300 | 70 | 30 |
| 12 | C/Li | UBM | −7 | 0(earth) | 10 | 300 | 60 | 32 |
| 13 | C/Al | UBM | −7 | 0(earth) | 10 | 300 | 50 | 25 |
| 14 | C | BM | 5 | 0(earth) | 10 | 300 | 0 | 0 |
| 15 | C | UBM | −7 | 0(earth) | 0.033 | 1 | 0 | 0 |
| 16 | C | UBM | −7 | −20 | 10 | 300 | 0 | 0 |
| 17 | C | UBM | −7 | −100 | 10 | 300 | 0 | 0 |
| 18 | C | UBM | −7 | −200 | 10 | 300 | 0 | 0 |

*: Every film forming rate was set at 30 nm/min.

Out of these, Nos. 1 to 8 are the inventive examples each using a UBM cathode, wherein Nos. 1 to 4 are the examples in which respective films were formed with both the sputter chamber and the base material at ground (earth) potential, and the film thickness was varied; No. 5 is the example in which a film was formed with the sputter chamber under floating conditions, and only the base material at ground (earth) potential; and Nos. 6 to 8 are the examples in which respective films were formed with their corresponding positive dc substrate bias voltages (25 to 100 V) individually applied.

Further, Nos. 9 and 10 are the examples in which films were formed by using a BM cathode with positive dc substrate bias voltages of 50 V and 100 V applied, respectively.

Any of these examples Nos. 1 to 10 provides the inventive thin film consisting of only C. Whereas, in Nos. 11 to 13, the inventive thin films were formed by respectively adding B and N (Example 11), Li (Example 12), and Al (Example 13) in addition to C as constitutive elements.

Any of the above examples satisfies the production method of the present invention. In every example, it was possible to obtain a thin film with a film thickness of at least 20 nm or more, which contained at least 20 or more clusters each having a diameter of at least 4 nm or more, and having an onion-like structure per 0.001 $\mu m^2$; or in which the volume fraction of clusters each having an onion-like structure in the matrix was at least 50% by weight or more.

In contrast, since the samples of Nos.14 to 18 were produced by methods not satisfying the requirements of the present invention, it was not possible to obtain desired thin films.

Out of these, No. 14 is the example in which a film was formed with both of the sputter chamber and the base material at ground (earth) potential by using a BM cathode; and Nos. 16 to 18 are the examples in which respective films were formed with a negative dc bias voltage applied to the base material by using a UBM cathode. Therefore, in every example, the potential of the substrate was negative with respect to the plasma, and hence it was not possible to obtain a desired thin film.

Further, No. 15 is the example in which a film was formed under the same conditions as in No.1, except that the film forming time was changed so that the film thickness was 1 nm. However, it was not possible to obtain a desired onion-like structure because of its too small film thickness.

The onion-like carbon film of the present invention is configured as described above, whereby it can find widespread uses such as electronic devices. Particularly, the thin film of the present invention has a film thickness of at least 20 nm or more, and a uniform onion-like structures, and hence it has a small coefficient of friction (0.15 or less with respect to iron-based materials in an atmosphere), and is excellent in durability. In these regards, it is expected to be applied to various hard protective films. In addition, since it is also excellent in electron emission characteristics, it is also expected to be applied to an electron emission source having a durability to be used in a field emission display, or the like.

Further, the production method of the present invention is accomplished based on a commonly adopted thin-film formation method referred to as sputtering, and therefore it can find widespread adoption for industrial use, and it can be preferably applied to various uses.

What is claimed is:

1. A uniform onion-like carbon thin film, comprising carbon as a main component, the thin film having a film thickness of at least 20 nm or more, and having fullerene clusters throughout the film, the clusters being predominantly of onion-like structure.

2. The onion-like carbon thin film according to claim 1, having at least 20 or more clusters each having an onion-like structure, and having a diameter of at least 4 nm or more per 0.001 $\mu m^2$.

3. The onion-like carbon thin film according to claim 1, wherein the proportion of the clusters each having an onion-like structure in a matrix is at least 50% by volume or more.

4. A method for producing the onion-like carbon thin film according to any one of claims 1 to 3, comprising:
   sputter-forming a film to a film thickness of at least 20 nm or more upon the surface of a base material such that the plasma space potential is lower than the surface potential of the base material to be subjected to film formation.

5. The production method according to claim 4, wherein the film is sputter-formed by applying the base material to be subjected to film formation with a positive bias voltage.

6. The production method according to claim 4, wherein the film is sputter-formed by using an unbalanced magnetron sputtering method.

7. The production method according to claim 5, wherein the film is sputter-formed by using an unbalanced magnetron sputtering method.

8. A structure comprising a base material having upon a surface thereof a uniform onion-like carbon film according to claim 1.

9. A structure according to claim 8 wherein the base material is a machine part.

10. A structure according to claim 9 wherein the uniform onion-like carbon film is a solid lubricating film.

11. A structure according to claim 8 wherein the base material is an electronic part.

12. A structure according to claim 11 wherein the electronic part is a field emission electronic part.

13. A structure according to claim 12, wherein the emission electronic part is a field emission display part.

* * * * *